United States Patent
Mun et al.

(10) Patent No.: US 12,550,725 B2
(45) Date of Patent: Feb. 10, 2026

(54) STRUCTURE FOR GALVANIC ISOLATION USING DIELECTRIC-FILLED TRENCH IN SUBSTRATE BELOW ELECTRODE

(71) Applicant: GlobalFoundries Singapore Pte. Ltd., Singapore (SG)

(72) Inventors: Bong Woong Mun, Singapore (SG); Jeoung Mo Koo, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 399 days.

(21) Appl. No.: 18/155,890

(22) Filed: Jan. 18, 2023

(65) Prior Publication Data

US 2024/0243058 A1 Jul. 18, 2024

(51) Int. Cl.
*H01L 23/522* (2006.01)
*H01L 21/762* (2006.01)
*H10D 1/20* (2025.01)

(52) U.S. Cl.
CPC ........ *H01L 23/5227* (2013.01); *H01L 21/762* (2013.01); *H01L 23/5226* (2013.01); *H10D 1/20* (2025.01)

(58) Field of Classification Search
CPC ............... H01L 23/5227; H01L 21/762; H01L 23/5226; H01L 23/53295; H01L 2224/0236; H01L 2224/02371; H01L 2224/02375; H01L 2224/02381; H01L 21/76224; H01L 21/76898; H01L 23/5223; H01L 21/76802–76817; H01L 21/76877–76883; H10D 1/20; H10D 84/0186; H10D 84/0188; H10D 84/038; H10D 84/85

See application file for complete search history.

(56) References Cited

U.S. PATENT DOCUMENTS

| | | | |
|---|---|---|---|
| 7,361,571 B2 | 4/2008 | Nam | |
| 7,470,991 B2 | 12/2008 | Larkin et al. | |
| 8,659,149 B2 | 2/2014 | French et al. | |
| 8,957,500 B2 | 2/2015 | Dubois et al. | |
| 9,299,697 B2 | 3/2016 | West et al. | |
| 9,380,705 B2 | 6/2016 | Chen | |

(Continued)

FOREIGN PATENT DOCUMENTS

CN 112420661 A 2/2021

OTHER PUBLICATIONS

Extended European Search report from corresponding European patent application No. 23204518.7 dated Apr. 17, 2024, 11 pages.

(Continued)

*Primary Examiner* — Cuong B Nguyen

(74) *Attorney, Agent, or Firm* — Francois Pagette; Hoffman Warnick LLC

(57) ABSTRACT

A structure includes a substrate having a frontside and a backside. A first electrode is in a first insulator layer and is adjacent to the frontside of the substrate. The first electrode is part of a redistribution layer (RDL). A second electrode is between the substrate and the first electrode. A dielectric-filled trench in the substrate is under the first electrode and the second electrode, the dielectric-filled trench may extend fully to the backside of the substrate. The structure provides a galvanic isolation that exhibits less parasitic capacitance to the substrate from the lower electrode.

17 Claims, 9 Drawing Sheets

(56) References Cited

U.S. PATENT DOCUMENTS

| | | | |
|---|---|---|---|
| 10,020,239 | B2 | 7/2018 | Tsao et al. |
| 10,211,147 | B2 | 2/2019 | Zhang et al. |
| 10,672,795 | B2 | 6/2020 | Singh et al. |
| 11,158,640 | B2 | 10/2021 | Sugioka et al. |
| 11,211,283 | B2 | 12/2021 | Singh et al. |
| 11,469,194 | B2 | 10/2022 | Colpani et al. |
| 11,637,105 | B2 | 4/2023 | Sugioka et al. |
| 11,764,273 | B2 | 9/2023 | Mun et al. |
| 11,791,379 | B2 | 10/2023 | Mun et al. |
| 2003/0067052 | A1 | 4/2003 | Matsuo et al. |
| 2003/0207532 | A1 | 11/2003 | Chudzik et al. |
| 2006/0027890 | A1 | 2/2006 | Yang et al. |
| 2013/0087914 | A1 | 4/2013 | Yang et al. |
| 2016/0163749 | A1 | 6/2016 | Yang et al. |
| 2017/0263696 | A1 | 9/2017 | West et al. |
| 2018/0323133 | A1* | 11/2018 | Kirby .................. H01L 23/5227 |
| 2019/0326509 | A1 | 10/2019 | Yi et al. |
| 2020/0006386 | A1 | 1/2020 | Singh et al. |
| 2021/0074675 | A1 | 3/2021 | Shini |
| 2022/0165658 | A1 | 5/2022 | Mun et al. |
| 2022/0254740 | A1 | 8/2022 | West |
| 2023/0005818 | A1* | 1/2023 | Lee .................. H01L 23/481 |
| 2023/0361173 | A1 | 11/2023 | Mun et al. |

OTHER PUBLICATIONS

U.S. Appl. No. 17/644,626, filed Dec. 16, 2021, entitled "Galvanic Isolation Using Isolation Break Between Redistribution Layer Electrodes," 26 pages.

U.S. Appl. No. 17/644,626, Ex Parte Quayle Action dated Apr. 12, 2023, 6 pages.

U.S. Appl. No. 17/644,626, Response to Ex Parte Quayle Action filed Apr. 13, 2023, 6 pages.

U.S. Appl. No. 17/644,626, Notice of Allowance dated Jul. 12, 2023, 9 pages.

U.S. Appl. No. 18/428,035, filed Jan. 31, 2024, entitled "Structure With Capacitive Junction Between Silicide Layer and Electrode and Related Method," 37 Pages.

U.S. Appl. No. 18/354,941 Non-Final Office Action dated Sep. 24, 2025, 47 pages.

* cited by examiner

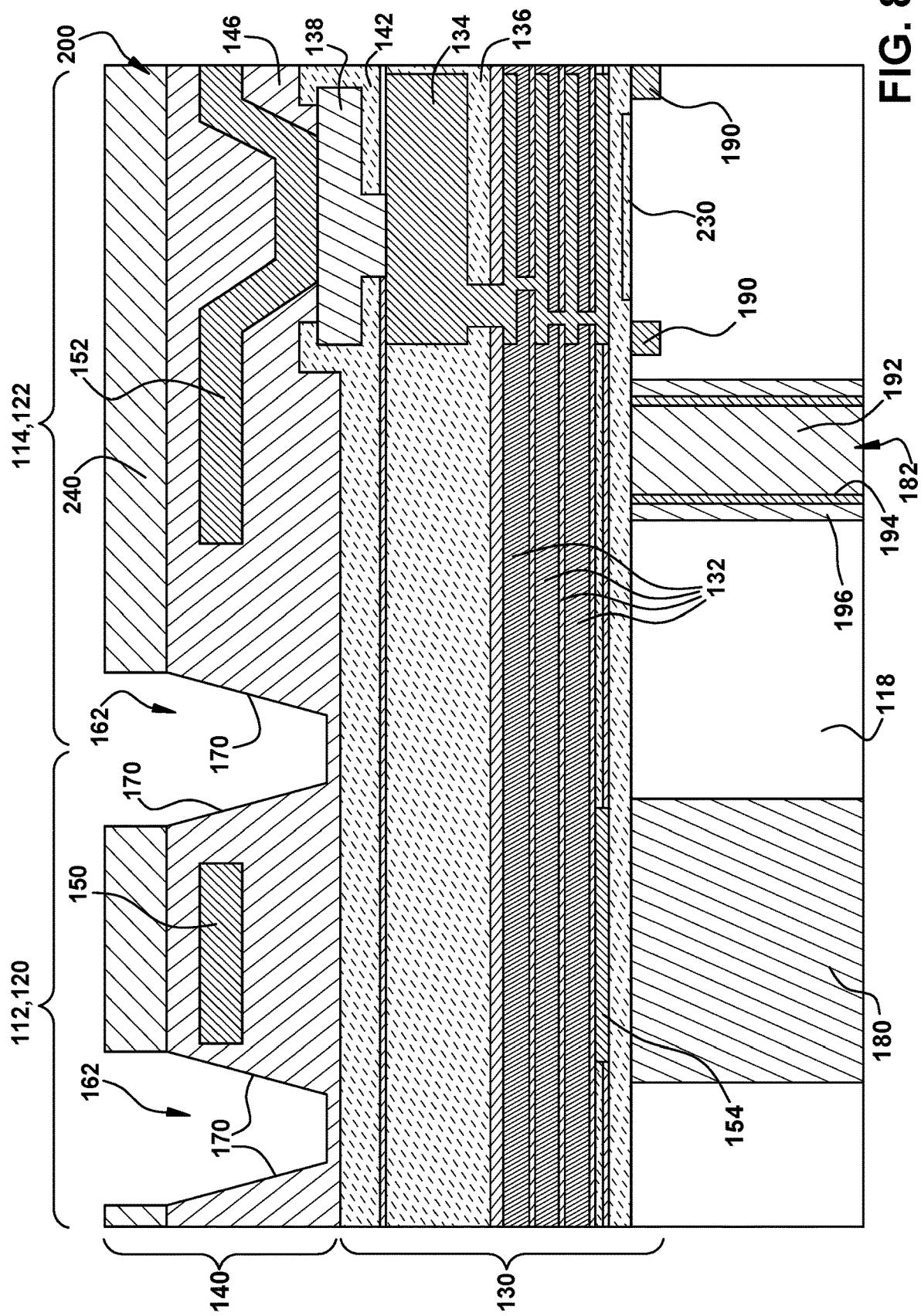

STRUCTURE FOR GALVANIC ISOLATION USING DIELECTRIC-FILLED TRENCH IN SUBSTRATE BELOW ELECTRODE

BACKGROUND

The present disclosure relates to integrated circuits, and more specifically, to a structure including a galvanic isolation with reduced parasitic capacitance into the substrate, and a related method.

A galvanic isolation is an isolation that prevents a first circuit from electrically communicating direct current (DC) and unwanted alternating current (AC) with a second circuit but allows the two circuits to communicate through other mechanisms such as optics, inductance, capacitance, or other means. The two circuits are typically at different electrical voltages, e.g., a high-voltage and a low-voltage. Galvanic isolations are typically created by forming a parallel-plate capacitor using electrodes in different metallization layers of the integrated circuit, such as different metallization layers in the back-end-of-line (BEOL) interconnect layers. The dielectrics of the BEOL layers separate the electrodes to form the capacitor. For higher voltage applications, the thickness of BEOL dielectric layers or the number of BEOL dielectric layers are increased to provide a higher breakdown voltage. As devices have scaled, the distance between some electrodes and the substrate have decreased, which increases parasitic capacitance into the substrate. The available space to add dielectric thickness or increase the number of dielectric layers between the electrode and the substrate to create a reliable and strong galvanic isolation is limited.

SUMMARY

An aspect of the disclosure is directed to a structure, comprising: a substrate having a frontside and a backside; a first electrode in a first insulator layer adjacent to the frontside of the substrate, the first electrode being part of a redistribution layer (RDL); a second electrode between the substrate and the first electrode; and a dielectric-filled trench in the substrate under the first electrode and the second electrode, the dielectric-filled trench extending fully to the backside of the substrate.

Another aspect of the disclosure includes a structure, comprising: a substrate having a frontside and a backside; a first electrode in a first insulator layer adjacent to the frontside of the substrate, the first electrode being part of a redistribution layer (RDL); a second electrode between the substrate and the first electrode; and a deep trench isolation (DTI) in the substrate under the first electrode and the second electrode, the DTI into the substrate toward the backside of the substrate.

An aspect of the disclosure related to a method comprising: forming a dielectric-filled trench in a substrate, the dielectric-filled trench extending from a frontside to a backside of the substrate; forming a complementary metal oxide semiconductor (CMOS) device over the substrate; forming a first electrode over the dielectric-filled trench as part of forming a plurality of interconnect layers over the CMOS device, the plurality of interconnect layers including a redistribution layer (RDL) in a first insulator layer; and forming a second electrode in the RDL and over the first electrode and the dielectric-filled trench.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein:

FIGS. 6A-6D, 7A-7D and 8A-8B show cross-sectional views of methods for forming structure including a galvanic isolation, according to the various embodiments of the disclosure.

Figure 1:
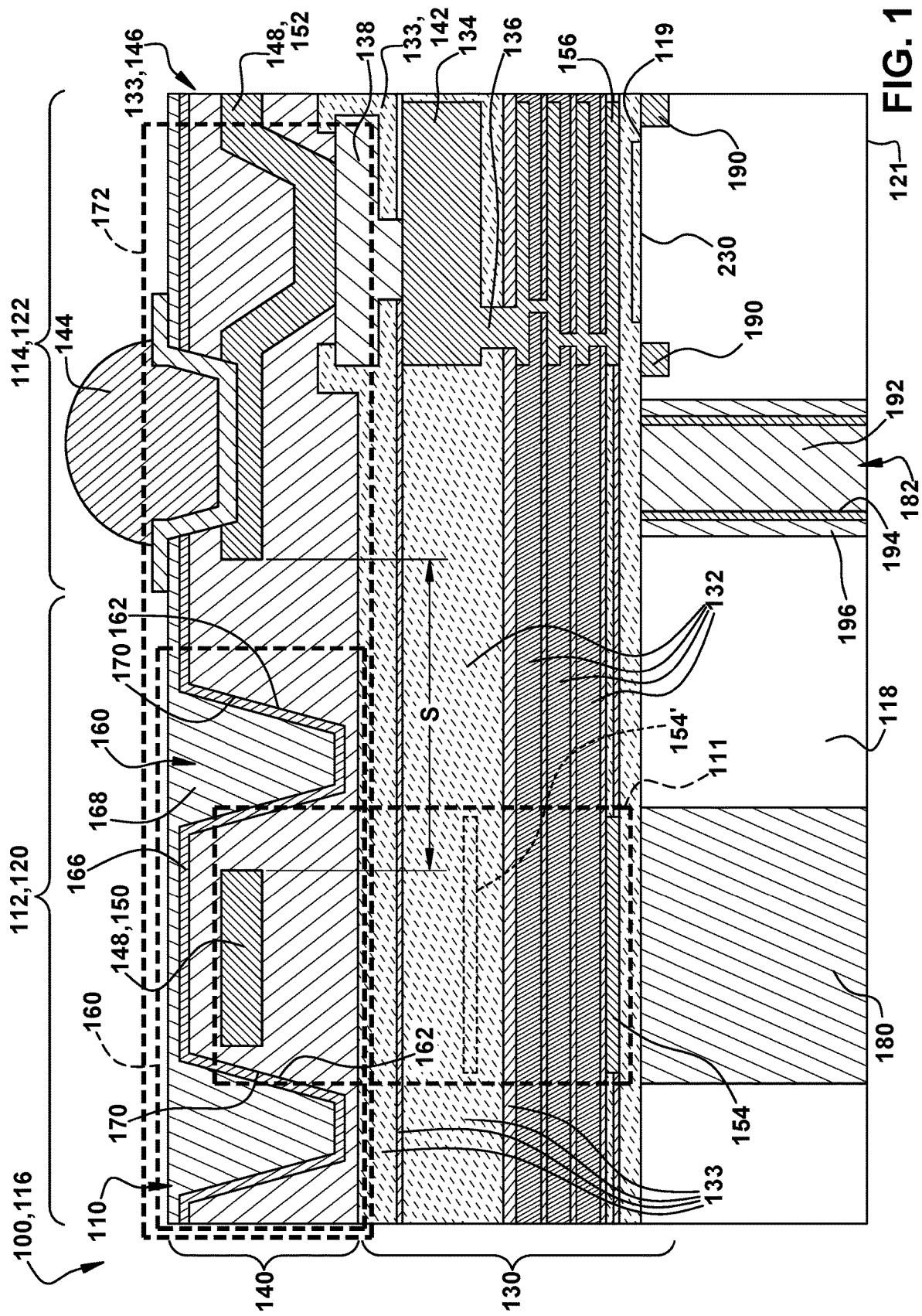
FIG. 1 shows a cross-sectional view of a structure including a galvanic isolation, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include a structure including a galvanic isolation. The structure includes a substrate having a frontside and a backside. An upper electrode is in a first insulator layer and is adjacent to the frontside of the substrate. The upper electrode is part of a redistribution layer (RDL). A lower electrode is between the substrate and the upper electrode. A dielectric-filled trench is in the substrate under the lower electrode and the upper electrode. The dielectric-filled TSV may extend fully to the backside of the substrate. In another embodiment, a deep trench isolation (DTI) in the substrate may replace the dielectric-filled trench; the DTI is shallower in the substrate than the dielectric-filled trench. In any case, the structure provides a galvanic isolation that exhibits less parasitic capacitance to the substrate from the lower electrode. The structure may also include another, side electrode in the first insulator layer laterally spaced from the upper electrode and an isolation break in a trench defined in the first insulator layer between the upper electrode and the side electrode. The galvanic isolation may separate, for example, voltage domains having different voltage levels. The galvanic isolation provides a stronger (e.g., kilo-Volt level) galvanic isolation by increasing capacitive coupling and reducing parasitic capacitive leakage to the substrate using the dielectric-filled trench or DTI. The galvanic isolation provides stronger protection than available with more or thicker BEOL interconnect layers. A related method is also disclosed.

Figure 3:
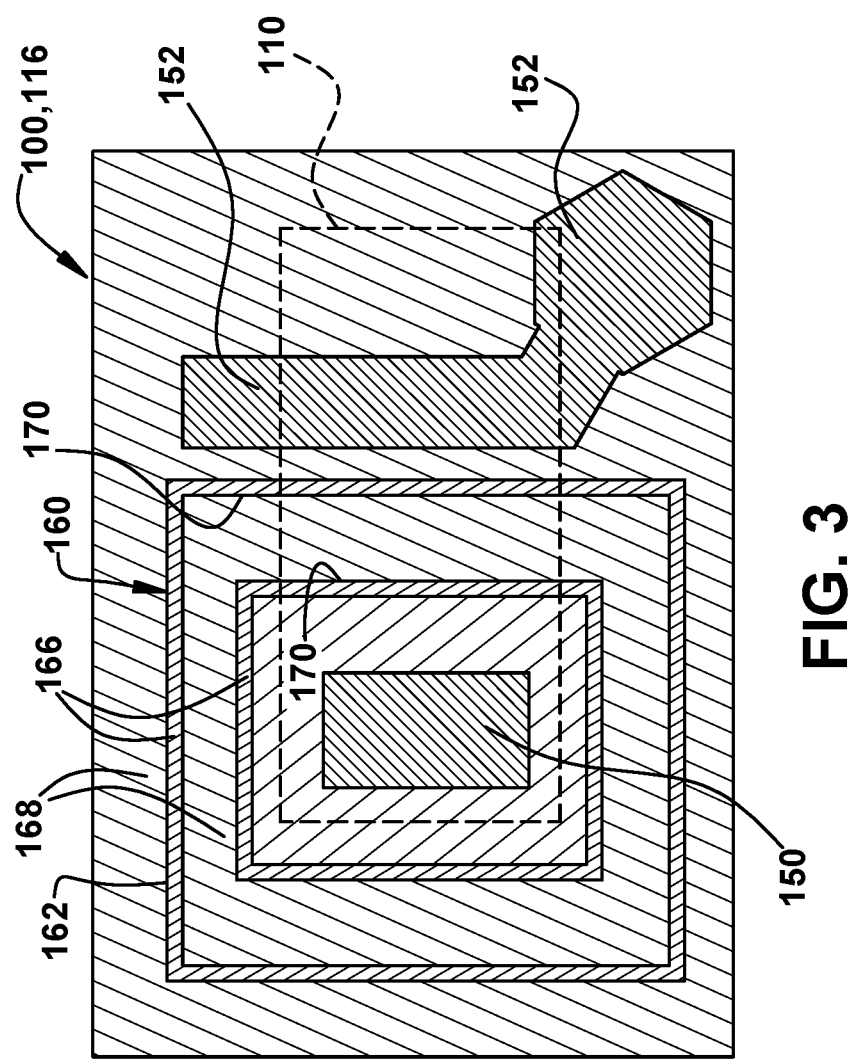
FIG. 3 shows a top-down view of a structure including a galvanic isolation, according to other embodiments of the disclosure.

FIG. 1 shows a cross-sectional view and FIG. 3 shows a top-down view of a structure 100 according to embodiments of the disclosure. Structure 100 includes a galvanic isolation 110 (hereafter "isolation 110") including a vertical portion 111 (vertical dashed box) and, optionally, a horizontal portion 172 (horizontal dashed box). As shown in FIG. 1, structure 100 includes a substrate 118 (e.g., a monocrystalline semiconductor substrate, such as a silicon substrate, a germanium substrate, a silicon germanium substrate, etc.) including a frontside 119 and a backside 121. Isolation 110 is, at least in part, in a galvanic isolation region 112 adjacent a logic region 114 in an integrated circuit (IC) structure 116 in/over substrate 118. Logic region 114 may include any now known or later developed integrated circuit functional elements (not shown) formed over substrate 118, such as but not limited to complementary metal-oxide semiconductor (CMOS) devices 230 (shown schematically) such as transistors (below M1 layer), resistors, capacitors, etc. Galvanic isolation region 112 may represent a first voltage domain 120, and logic region 114 may represent a second voltage domain 122. First voltage domain 120 and second voltage domain 122 have different operative voltages. For example, first voltage domain 120 may be a relatively high-voltage domain on substrate 118 and second voltage domain 122 may be a relatively low-voltage domain on substrate 118. In any event, second voltage domain 122 operates at a lower voltage than first voltage domain 120.

Any now known or later developed back-end-of-line (BEOL) interconnect layers 130 may be provided in logic region 114 and in galvanic isolation region 112. It is noted that BEOL interconnect layers 130 may include any now known or later developed interlayer dielectric (ILD) layers 132 with conductive wire 134 and/or via 136 electrical interconnects therein for electrically interconnecting parts in, for example, logic region 114. ILD layers 132 may include but are not limited to: silicon dioxide; silicon nitride; carbon-doped silicon dioxide materials; fluorinated silicate glass (FSG); organic polymeric thermoset materials; silicon oxycarbide; SiCOH dielectrics; spin-on glasses; silsesquioxanes; and any silicon-containing low-k dielectric. Wires 134 and vias 136 may include any appropriate conductor, e.g., tungsten, cobalt, copper, aluminum, etc., and any appropriate liner, e.g., tantalum nitride, tantalum, etc. While a certain number of BEOL interconnect layers 130 are illustrated, any number may be used, and they may have any thickness desired to accommodate the structures therein. BEOL interconnect layers 130 scale electrical interconnects, e.g., wires 134 and vias 136, until the structures, such as input/output pads 138, are large enough to interconnect to external structure of IC structure 116. BEOL interconnect layers 130 may also include outermost BEOL interconnect layers 133, which may be referred to as far BEOL (FBEOL) layers.

Structure 100 includes a redistribution layer (RDL) 140 over an outermost ILD layer 142 including I/O pads 138 (only one of the latter shown for clarity). RDL 140 and ILD layer 142 may be part of FBEOL layers 133 because they are the outermost interconnect layers in IC structure 116. RDL 140 is an extra metal layer on an IC die that makes I/O pads 138 of IC structure 116 available in other locations of the die for better accessibility to I/O pads 138, where necessary. An RDL 140 spreads the contact points around IC structure 116 so that solder balls 144 can be applied, and thermal stress can be distributed. RDL 140 includes a first insulator layer 146 including metal wires 148 therein to move the contact points to locations other than I/O pads 138. First insulator layer 146 may include any now known or later developed dielectric appropriate for an RDL 140. In one embodiment, first insulator layer 146 includes a polyimide. First insulator layer 146 thus may have a dielectric strength of, for example, approximately 300 root mean square voltage per micrometer (Vrms/µm). However, in other embodiments (not shown), first insulator layer 146 may include at least one nitride layer and at least one oxide layer, i.e., formed horizontally across regions 112, 114. The nitride layer(s) and oxide layer(s) replace polyimide. The use of nitride layer(s) and oxide layer(s) allow for further increasing and/or customization of the dielectric strength of isolation 110.

Structure 100, employing select metal wires 148 in RDL 140, includes an electrode 150 in first insulator layer 146. "Electrode" as used herein may include any conductor capable of providing an electrical element for a capacitor or an inductor. Electrode 150 (referred to herein as "upper electrode 150" for differentiation purposes) is in first insulator layer 146 adjacent to frontside 119 of substrate 118, i.e., it is above frontside 119. Upper electrode 150 is thus part of RDL 140. As will be further described herein, structure 100 may, optionally, include another side electrode 152 in first insulator layer 146 laterally spaced from upper electrode 150. In this case, upper electrode 150 and electrode 152 (latter referred to herein as "side electrode 152" for differentiation purposes) are both part of RDL 140, the latter of which may include other metal wires 148, not shown. Upper electrode 150 can have any desired lateral layout. In the example shown, upper electrode 150 may be electrically coupled by a plurality of (BEOL) interconnect layers 130 to second voltage domain 122, e.g., in logic region 114. As noted, first voltage domain 120 and second voltage domain 122 may have different operative voltages. For example, first voltage domain 120 may be a relatively high-voltage domain and second voltage domain 122 may be a relatively low-voltage domain.

Structure 100 also includes an electrode 154 between substrate 118 and upper electrode 150. Electrode 154 (referred to herein as "lower electrode 154" for differentiation purposes) is vertically separated from upper electrode 150 by a plurality of ILD layers 132 of BEOL interconnect layers 130, forming a vertical portion 111 of galvanic isolation 110. Any number of ILD layers 132 may be used so long as lower electrode 154 is under upper electrode 150. Lower electrode 154 may be in any metal layer (M1, M2, etc.) of first voltage domain 120 between substrate 118 and upper electrode 150. In FIG. 1, for example, lower electrode 154 is in a first metal layer 156 of structure 100. Alternatively, as shown with a dashed box in FIG. 1, lower electrode 154' can be located in any BEOL interconnect layer 130 above first metal layer 156, so long as it is between upper electrode 150 and substrate 118.

As noted, lower electrode 154 may experience parasitic capacitance to substrate 118. The addition of thickness to the dielectric layer in which lower electrode 154 is located, or the addition of dielectric layers between lower electrode 154 and substrate 118 may not be possible. In certain embodiments, shown in FIG. 1, structure 100 also includes a dielectric-filled trench 180 in substrate 118 under upper electrode 150 and lower electrode 154. Dielectric-filled trench 180 extends fully to backside 121 of substrate 118. As will be described, dielectric-filled trench 180 may be formed as part of a through substrate via (TSV) 182 formation process. In other embodiments, shown in FIG. 2, structure 100 may include a deep trench isolation (DTI) 184 in substrate 118 under upper electrode 150 and lower electrode 154. DTI 184 extends into substrate 118 toward backside 121 of substrate 118 but does not extend fully to backside 121. That is, some of substrate 118 is between a lower surface 186 of DTI 184 and backside 121 of substrate 118. In any event, dielectric-filled trench 180 or DTI 184 may include any appropriate dielectric material capable of formation in substrate 118 such as, but not limited to, any ILD material listed herein for interconnect layers 130, e.g., silicon oxide. Dielectric-filled trench 180 or DTI 184 can be filled with a single layer of dielectric material or multiple layers of dielectric material where at least two of the layers are different dielectric materials. Optionally, the dielectric material within the dielectric-filled trench 180 or DTI 184 can encapsulate one or more cavities filled with air or gas or under vacuum. Dielectric-filled trench 180 or DTI 184 reduces parasitic capacitance to substrate 118 from lower electrode 154 without requiring thicker or additional BEOL interconnect layers 130 (i.e., dielectric portions thereof) between lower electrode 154 and substrate 118 or requiring lower electrode 154 to be moved higher than first metal layer 156 to increase the number of BEOL interconnect layers 130 between lower electrode 154 and substrate 118. As also shown in FIGS. 1 and 2, dielectric-filled trench 180 (FIG. 1) or DTI 184 (FIG. 2) may be wider than lower electrode 154, i.e., to better prevent parasitic capacitance coupling with substrate 118.

Figure 2:
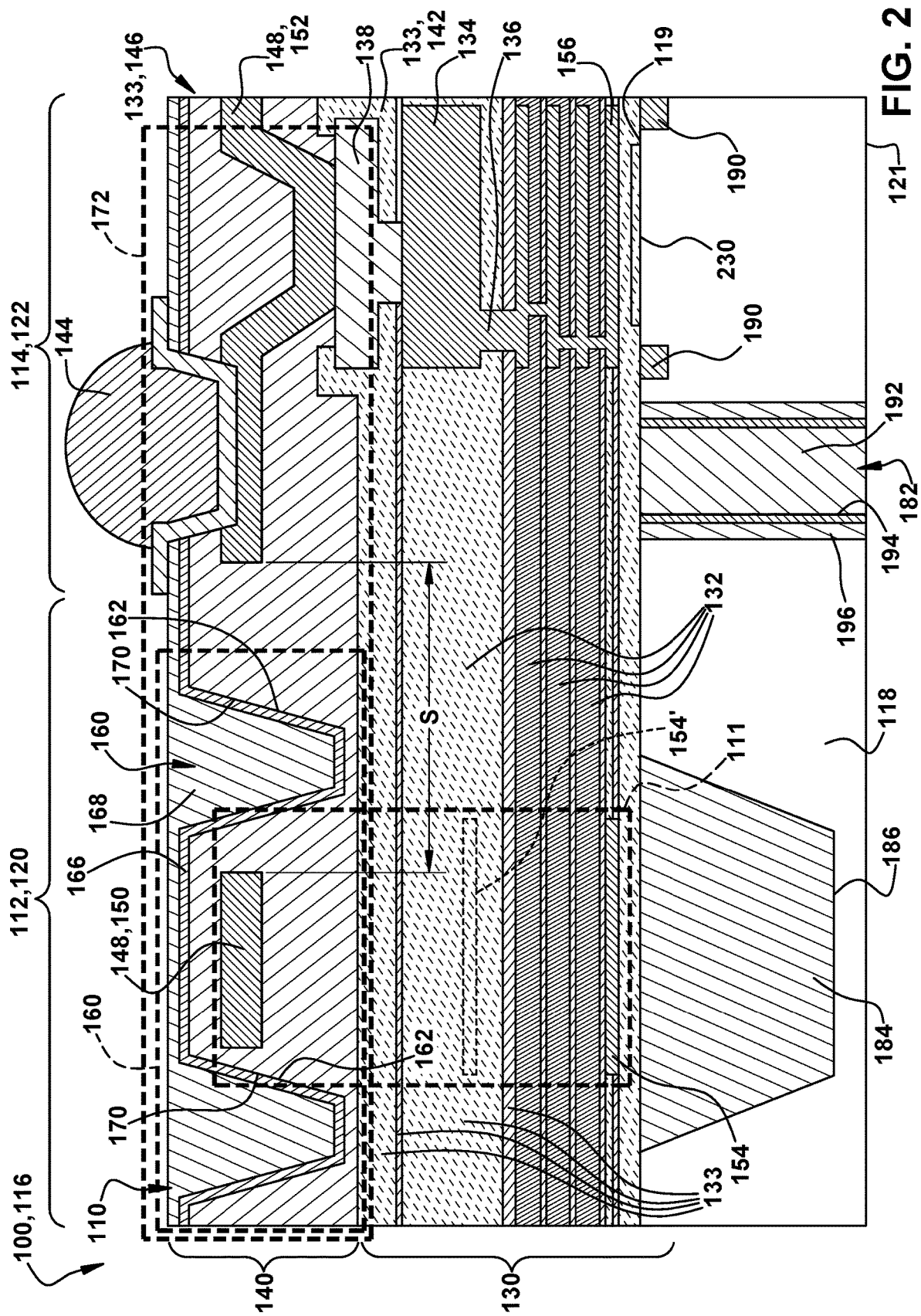
FIG. 2 shows a cross-sectional view of a structure including a galvanic isolation, according to other embodiments of the disclosure.

As noted, and as shown in FIGS. 1 and 2, structure 100 may, optionally, include side electrode 152 in first insulator layer 146 laterally spaced from upper electrode 150. Upper electrode 150 and side electrode 152 are both part of RDL 140, the latter of which may include other metal wires 148, not shown. Upper electrode 150 and, where provided, side electrode 152 may be at the same level in first insulator layer 146. Hence, upper electrode 150 and side electrode 152 may be horizontally or laterally spaced apart a distance S, which can be user defined. As is conventional, other parts of metal wires 148 in RDL 140 can be at different levels for interconnection purposes, e.g., to I/O pads 138 or other structure. Electrodes 150, 152 can have any desired lateral layout. In the example shown, side electrode 152 may be electrically coupled by a plurality of interconnect layers 130 to second voltage domain 122, e.g., in logic region 114. As noted, first voltage domain 120 and second voltage domain 122 may have different operative voltages. For example, first voltage domain 120 may be a relatively high-voltage domain and second voltage domain 122 may be a relatively low-voltage domain.

Structure 100 may also include an isolation break 160 laterally adjacent upper electrode 150. Isolation break 160 (dashed box) electrically isolates upper electrode 150 and side electrode 152. As shown in FIG. 1, isolation break 160 includes a trench 162 defined in first insulator layer 146 between upper electrode 150 and side electrode 152. At least one second insulator layer 166, 168 is in trench 162. Hence, first insulator layer 146 and at least one second insulator layer 166, 168 are between upper electrode 150 and side electrode 152. Each second insulator layer 166, 168 has a higher dielectric constant than first insulator layer 146. In one embodiment, the second insulator layer(s) may include at least one nitride layer 166 and at least one oxide layer 168. In the example shown, at least one nitride layer 166 lines a sidewall 170 of trench 162, and at least one oxide layer 168 fills a remaining portion of trench 162. However, other arrangements of nitride and oxide or other second insulator materials, are possible. In this manner, as shown best in FIG. 3, isolation break 160 includes a nitride-oxide-nitride arrangement between upper electrode 150 and side electrode 152. The nitride-oxide-nitride arrangement increases the capacitive coupling created by isolation 110 compared to vertical galvanic isolations using BEOL interconnect layers 130. Nitride layer(s) 166 may include but are not limited to silicon nitride, and oxide layer(s) 168 may include but are not limited to silicon oxide. As shown in FIG. 3, trench 162 and isolation break 160 may surround upper electrode 150.

Upper electrode 150 and lower electrode 154 are in first voltage domain 120 and are vertically separated by plurality of interconnect layers 130. Side electrode 152 is electrically coupled by a plurality of interconnect layers 130 to second voltage domain 122. As noted, first voltage domain 120 and second voltage domain 122 have different operative voltages.

Isolation break 160 provides additional dielectric strength, and hence increased capacitive coupling for isolation 110. The use of nitride layer(s) 166 and oxide layer(s) 168 allow for further increasing and/or customization of the dielectric strength of isolation 110. For example, silicon nitride has a dielectric strength of approximately 1100 Vrms/µm and silicon oxide (high temperature version) has a dielectric strength of approximately 500 Vrms/µm—compared to the approximately 300 Vrms/µm of polyimide. The types of materials, the thicknesses thereof, and width of trench 162 can all be customized to provide a desired dielectric strength for isolation break 160, and desired capacitive coupling of isolation 110. Other options for second insulator layer(s) 166, 168 may include but are not limited to: hydrogenated silicon oxycarbide (SiCOH) (~750 Vrms/μm) or porous SiCOH (750+ Vrms/μm). The type silicon oxide can also vary and may include, for example, tetraethyl orthosilicate, $Si(OC_2H_5)_4$ (TEOS) silicon oxide (~900 Vrms/μm) or low temperature silicon oxide (~500 Vrms/μm).

As shown in FIGS. 1 and 2, structure 100 may also include one or more shallow trench isolations (STI) 190, e.g., in logic region 114. As illustrated, STI(s) 190 extend less than dielectric-filled trench 180 (FIG. 1) or DTI 184 (FIG. 2) toward backside 121 of substrate 118. One or more TSVs 182 may also be laterally adjacent dielectric-filled trench 180 (FIG. 1) or DTI 184 (FIG. 2). TSVs 182 may include any via conductor 192 such as but not limited to tungsten, in a refractory metal liner 194 within a dielectric liner 196. Refractory metal liner 194 may include, for example, ruthenium (Ru), tantalum (Ta), titanium (Ti), tungsten (W), iridium (Ir), rhodium (Rh) and platinum (Pt), etc., or mixtures of thereof. Dielectric liner 196 may include any ILD material listed herein, such as but not limited to silicon oxide.

Figure 4:
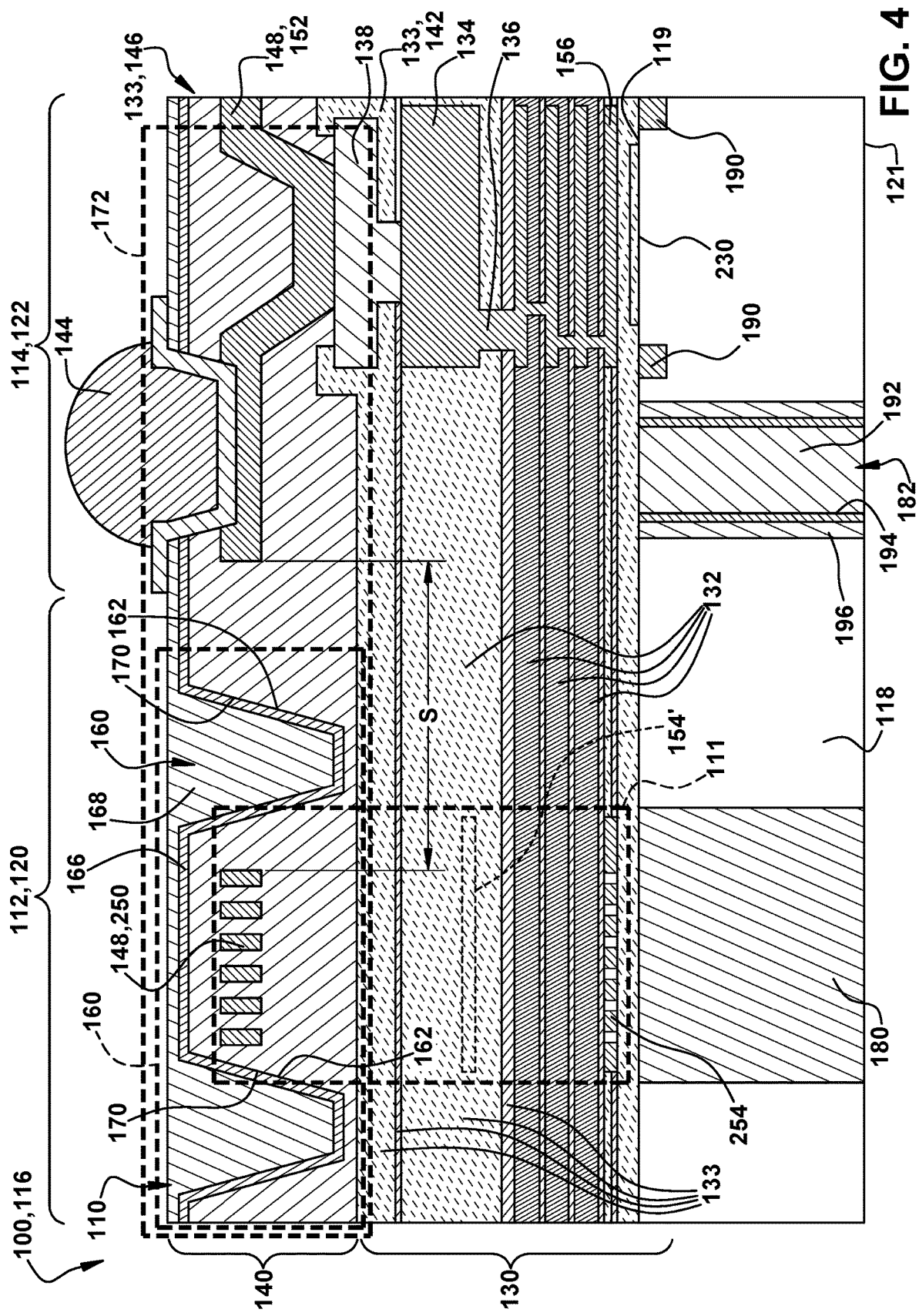
FIG. 4 shows a cross-sectional view of a structure including a galvanic isolation, according to yet other embodiments of the disclosure.
Figure 5:
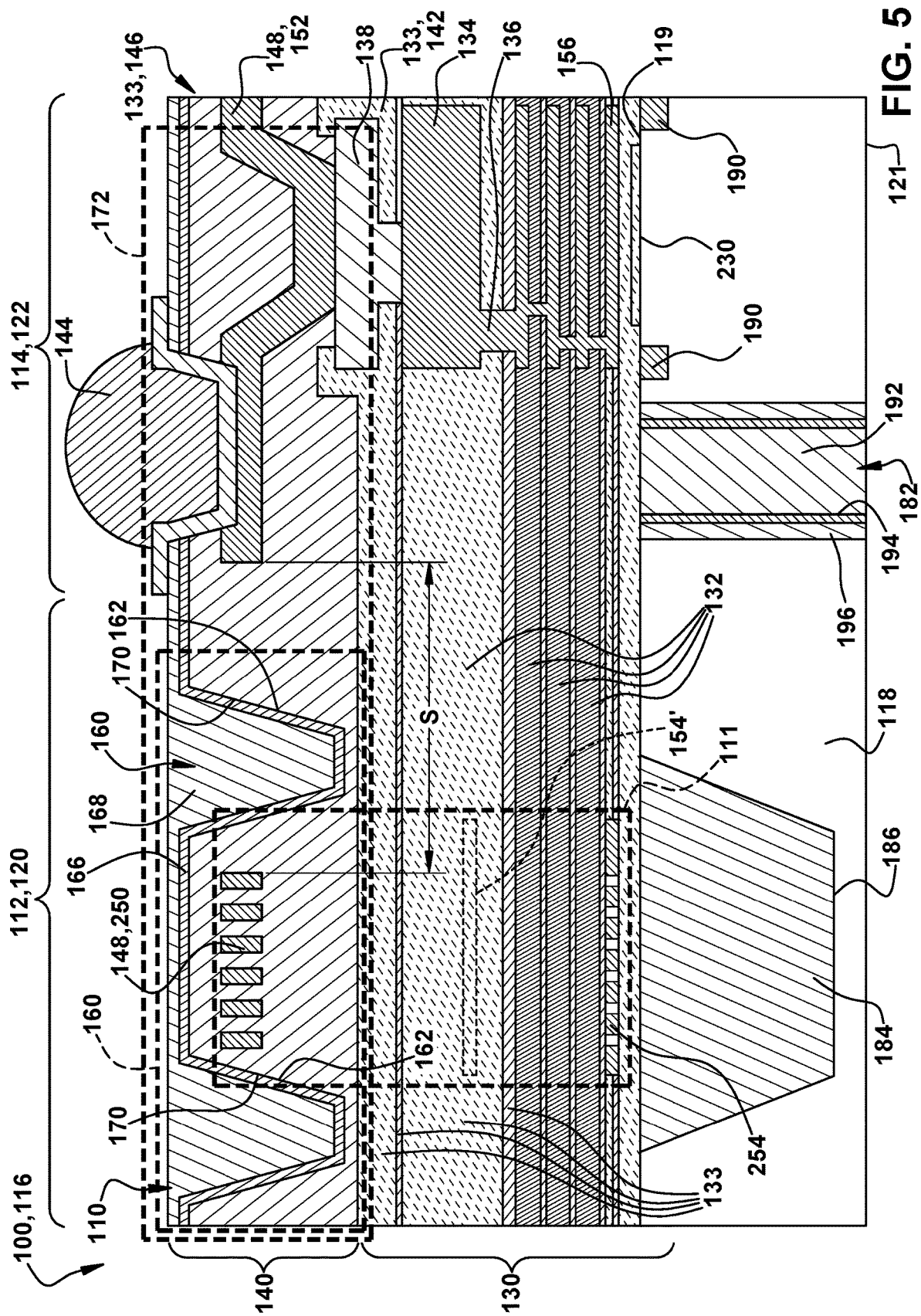
FIG. 5 shows a cross-sectional view of a structure including a galvanic isolation, according to yet other embodiments of the disclosure.

FIGS. 4 and 5 show cross-sectional views of alternative embodiments of the disclosure. Structure 100 in FIGS. 4 and 5 are similar to that shown in FIGS. 1 and 2, except at least one of upper electrode 150 and lower electrode 154 are constructed as an inductive coil 250, 254, i.e., with a spirally arranged coil. Inductive coils 250, 254 may include any number of turns therein, shown in cross-section.

Referring to FIGS. 1, 2, 6A-6D, 7A-7D and 8A-8B, cross-sectional views of a method according to embodiments of the disclosure are shown. FIGS. 6A-6D show forming a dielectric-filled trench 180 (FIG. 1) in substrate 118 extending from frontside 119 to backside 121 of substrate 118; and FIGS. 7A-7D show forming a DTI 184 (FIG. 2) in substrate 118 extending toward backside 121 of substrate 118, but not through to backside 121 thereof. FIGS. 6A-6D and 7A-7D also show optional formation of TSVs 182.

Figure 6A:
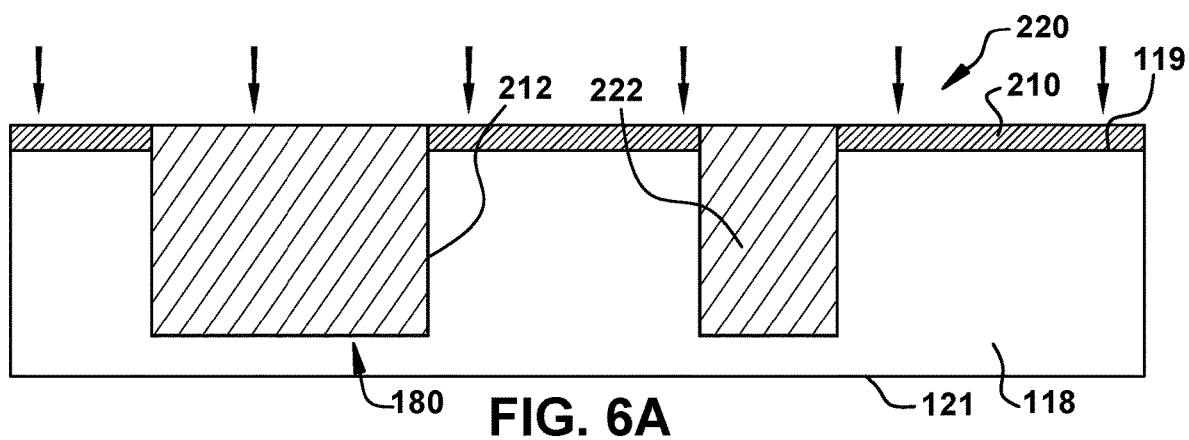

FIG. 6A shows an initial structure 200 per the FIG. 1 embodiment. Initial structure 200 includes substrate 118, which may include any now known or later developed semiconductor device material such as silicon, germanium, silicon germanium or other semiconductor material. Initial structure 200 in FIG. 6A is shown having a mask 210 thereon patterned for forming TSV trench opening 212 and TSV trench opening 222 from frontside 119 toward backside 121 of substrate 118 for forming dielectric-filled trench 180 (FIG. 1) and TSV 182 (FIG. 1) in substrate 118. Mask 210 may include any appropriate mask material for forming TSVs, and the etch may include any appropriate etch chemistry for substrate 118, e.g., a reactive ion etch. Mask 210 is used to form TSV trench opening 212 and TSV trench opening 222. TSV openings 212, 222 are filled with a dielectric. The dielectric can include any ILD material listed herein, such as but not limited to silicon oxide, and may be formed by any appropriate deposition process for the material used. As mentioned above with regard to the structure embodiments, the dielectric-filled trench 180 (FIG. 1) may be filled with a single layer of dielectric material or multiple layers of dielectric material where at least two of the layers are different dielectric materials. Optionally, the dielectric material can encapsulate one or more cavities filled with air or gas or under vacuum. Trench openings 212, 222 in FIG. 6A extend from frontside 119 toward backside 121 of substrate but do not extend through backside 121 of substrate 118, i.e., a portion of substrate 118 remains below the trench openings 212. The lateral size of trench opening 212 may be arranged such that dielectric-filled trench 180 is wider than lower electrode 154 subsequently formed thereover. Deposition of the dielectric material can be followed by a planarization, e.g., chemical mechanical polishing (CMP), and/or removal of mask 210 using any appropriate mask removal process.

Figure 6B:
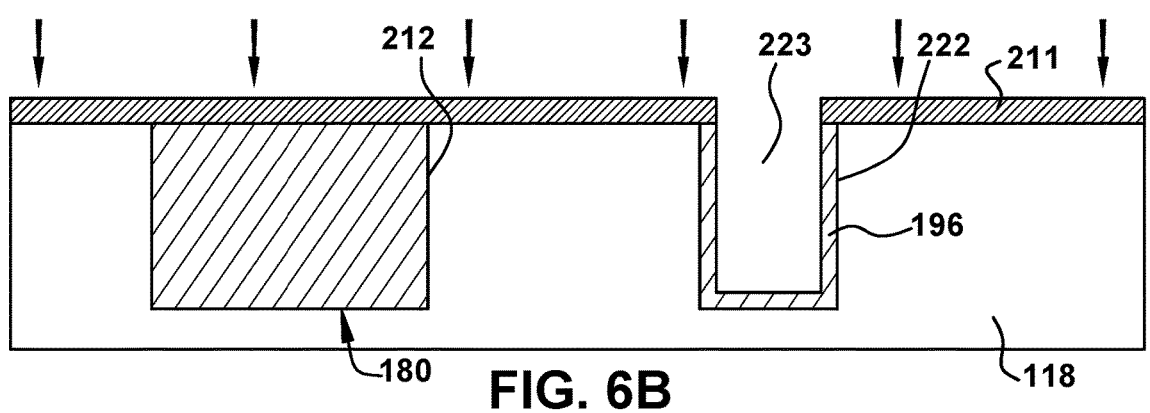
Figure 6C:
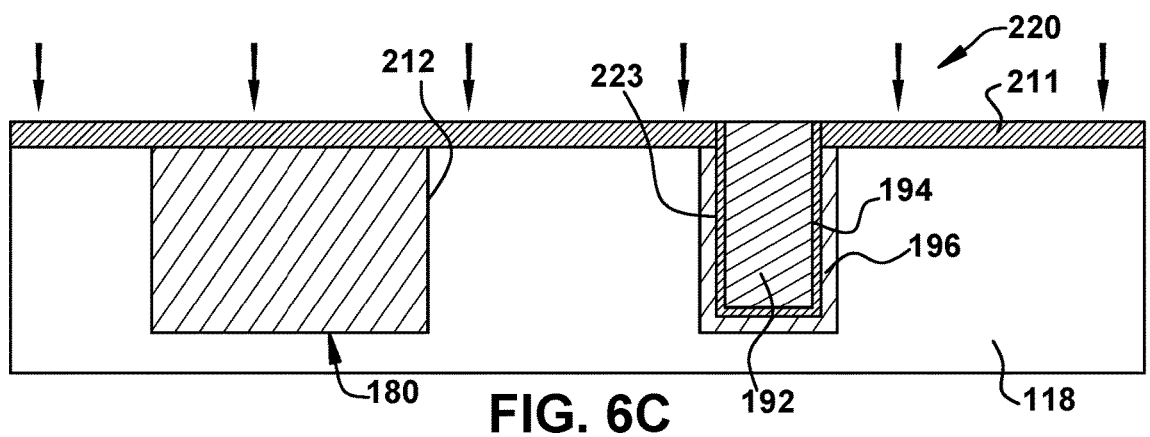

FIG. 6B shows the structure after opening the dielectric in TSV trench opening 222 (FIG. 6A), i.e., after mask 210 removal, and forming another mask 211 and etching to form an opening 223 in the dielectric. This process creates dielectric liner 196 for TSVs 182 (FIG. 1). FIG. 6C shows the structure after deposition of conductive layers for TSV 182 (FIG. 1) including conductor 192 such as but not limited to tungsten, in a refractory metal liner 194 within dielectric liner 196. Refractory metal liner 194 may include, for example, ruthenium (Ru), tantalum (Ta), titanium (Ti), tungsten (W), iridium (Ir), rhodium (Rh) and platinum (Pt), etc., or mixtures of thereof. The material deposition can be followed by a planarization, e.g., chemical mechanical polishing (CMP), and/or removal of mask 211 using any appropriate mask removal process.

Figure 6D:
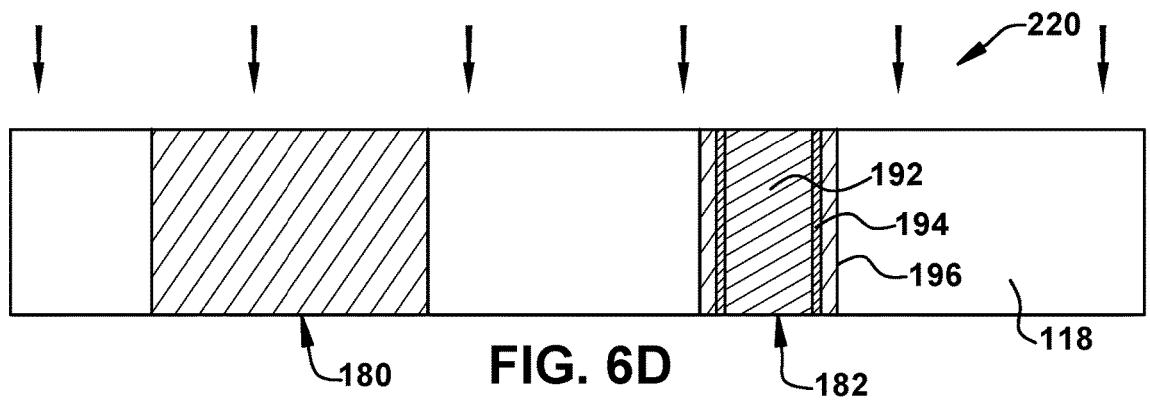

FIG. 6D shows the structure after forming dielectric filled trench 180 and TSV 182 by planarization, e.g., CMP, of backside 121 of substrate 118 to expose a bottom of dielectric-filled trench 180 and any TSVs 182 formed.

Figure 7A:
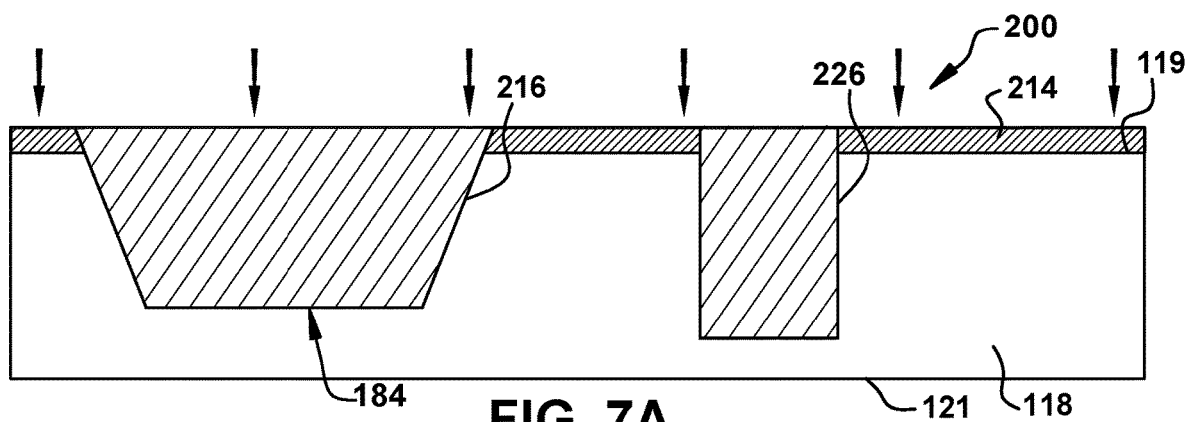

FIG. 7A shows an initial structure 200 per the FIG. 2 embodiment. Initial structure 200 includes substrate 118, which may include any now known or later developed semiconductor device material such as silicon, germanium, silicon germanium or other semiconductor material. Initial structure 200 in FIG. 7A is shown having a mask 214 thereon patterned for forming DTI trench opening 216 and TSV trench opening 226 from frontside 119 toward backside 121 of substrate 118 (but not through to substrate 118). Mask 214 may include any appropriate mask material for forming trench isolations, and the etch may include any appropriate etch chemistry for substrate 118, e.g., a reactive ion etch. Mask 214 is used to form DTI opening 216 and TSV trench opening 226 and may be removed thereafter using any appropriate mask removal process. Trench openings 216, 226 are filled with a dielectric, e.g., silicon dioxide, using any appropriate deposition process. The dielectric can include any ILD material listed herein, such as but not limited to silicon oxide, and may be formed by any appropriate deposition process for the material used. DTI 184 may be filled with a single layer of dielectric material or multiple layers of dielectric material where at least two of the layers are different dielectric materials.

Optionally, the dielectric material can encapsulate one or more cavities filled with air or gas or under vacuum. Trench openings 216, 226 in FIG. 7A extend from frontside 119 toward backside 121 of substrate but do not extend through backside 121 of substrate 118, i.e., a portion of substrate 118 remains below the trench openings 212. The lateral size of trench opening 216 may be arranged to ensure DTI 184 is wider than lower electrode 154 subsequently formed thereover. Deposition of the dielectric material can be followed by a planarization, e.g., chemical mechanical polishing (CMP), and/or removal of mask 214 using any appropriate mask removal process.

Figure 7B:
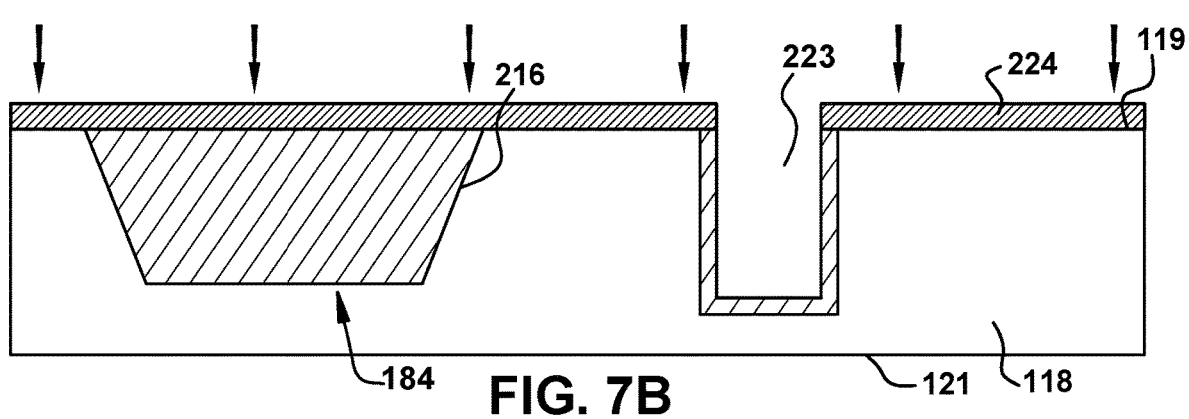

FIG. 7B shows forming a trench opening 223 for forming TSVs 182 (FIG. 2). FIG. 7B shows a mask 224 thereon patterned for forming another TSV trench opening 223 in the dielectric in trench opening 226 (FIG. 7A). Mask 224 may include any appropriate mask material for forming TSVs, and the etch may include any appropriate etch chemistry for the dielectric in trench opening 226, e.g., a reactive ion etch. Mask 224 is used to form TSV trench opening 223 and may be removed thereafter using any appropriate mask removal process.

Figure 7C:
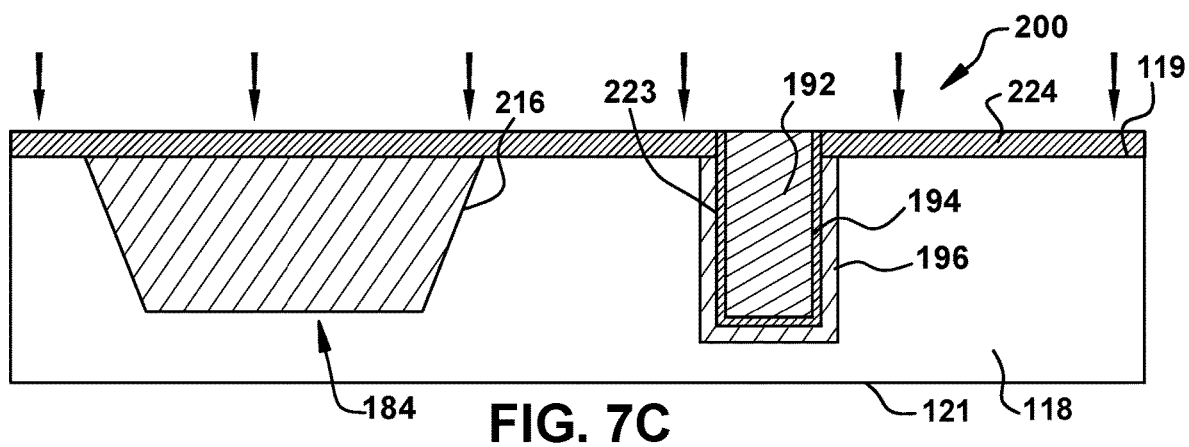

FIG. 7C shows the structure after deposition of layers for TSV 182 (FIG. 1) including conductor 192 such as but not limited to tungsten, in a refractory metal liner 194 within dielectric liner 196. Refractory metal liner 194 may include, for example, ruthenium (Ru), tantalum (Ta), titanium (Ti), tungsten (W), iridium (Ir), rhodium (Rh) and platinum (Pt), etc., or mixtures of thereof. The material deposition can be followed by a planarization, e.g., chemical mechanical polishing (CMP), and/or removal of mask 224 using any appropriate mask removal process.

Figure 7D:
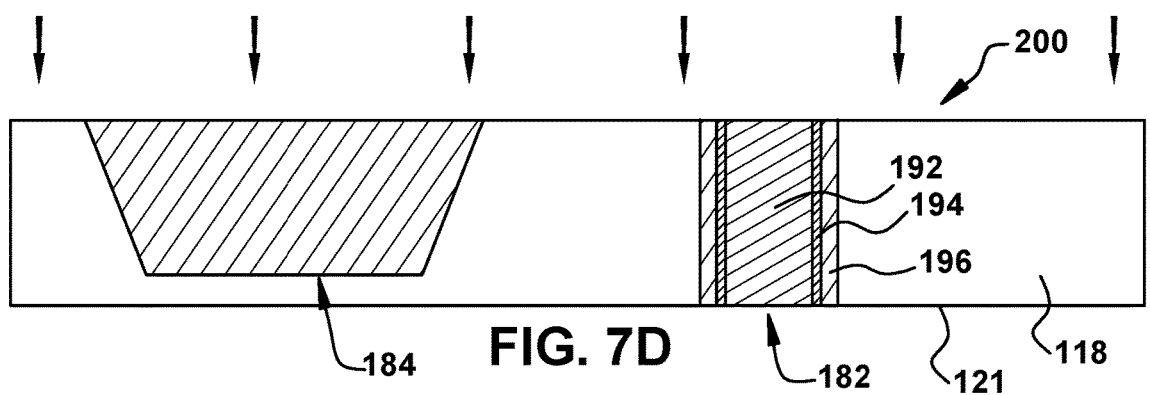

FIG. 7D shows the structure after forming TSV 182 by planarization, e.g., CMP, of backside 121 of substrate 118 to expose a bottom of TSV 182. A bottom of DTI 184 is not exposed by this planarization.

Figure 8B:
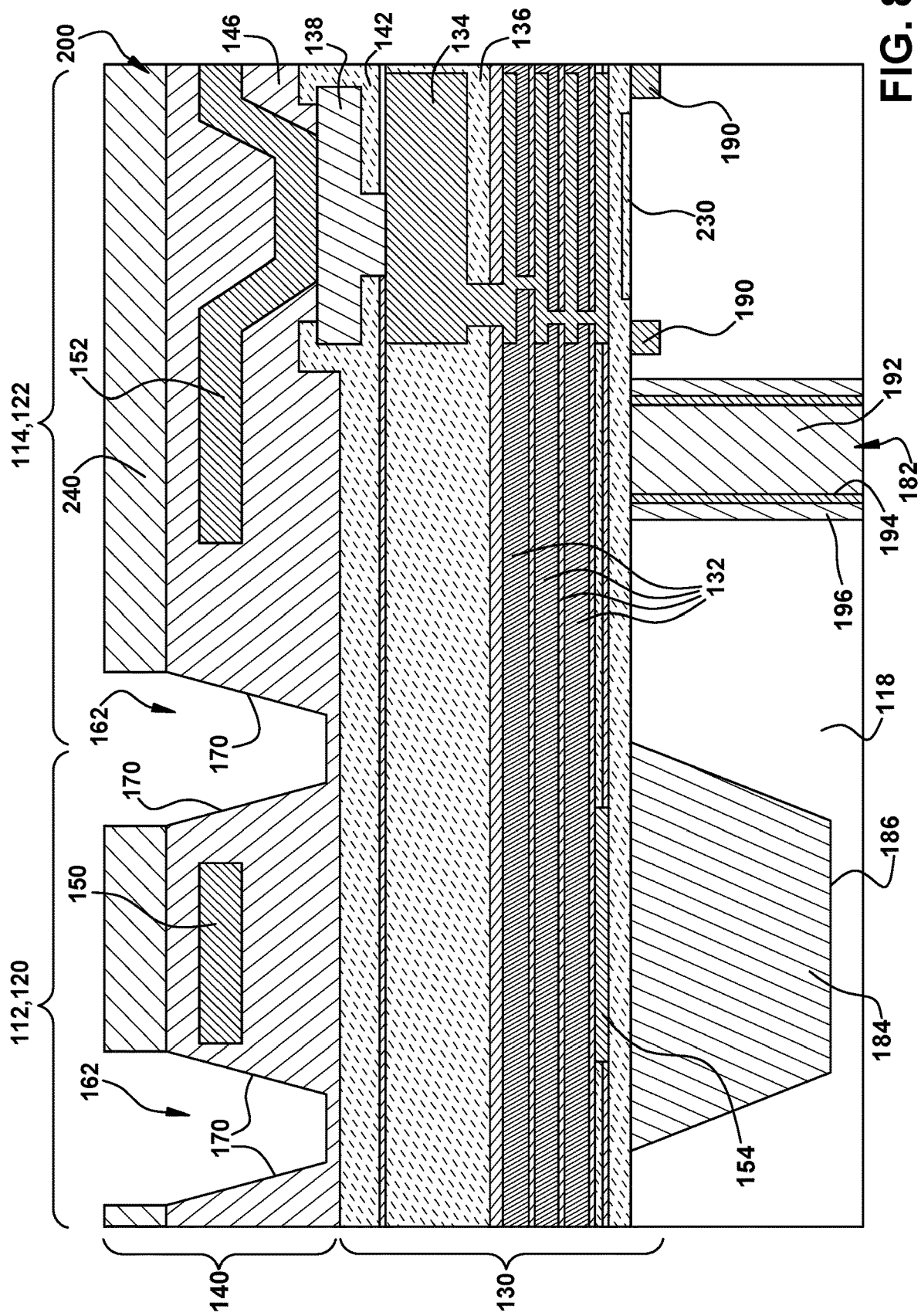

FIGS. 8A and 8B show processing after optionally forming STIs 190 adjacent dielectric-filled trench 180 and any TSVs 182 in substrate 118. STIs 190 can be formed using any now known or later developed processing, the details of which are omitted here to focus on the salient parts of the process.

FIGS. 8A and 8B show the structure after forming a complementary metal oxide semiconductor (CMOS) device 230 over substrate 118, i.e., in logic region 114. CMOS device 230 can include any now known or later developed structure, e.g., transistors, etc., and can be formed using any now known or later developed processing, the details of which are omitted here to focus on the salient parts of the process.

FIGS. 8A and 8B also show forming lower electrode 154 over dielectric-filled trench 180 (or DTI 184) as part of forming a plurality of interconnect layers 130 over CMOS device 230. As described herein, plurality of interconnect layers 130 include RDL 140 in first insulator layer 146 and upper electrode 150 over dielectric-filled trench 180 (or DTI 184).

FIGS. 8A and 8B also show forming upper electrode 150 in RDL 140 and over lower electrode 154 and dielectric-filled trench 180 (or DTI 184). More particularly, as shown, I/O pads 138 have been formed, and metal wires 148 in first insulator layer 146 have been formed. At this stage, upper electrode 150, side electrode 152 and lower electrode 154, as previously described herein, have also been formed in one of interconnect layers 130, i.e., as part of the selected metal layer. Electrodes 150, 152, 154 may be formed using any now known or later developed processes, e.g., conventional CMOS processes such as damascene processes. For example, metal wires 148 include, among other structure (not shown), upper electrode 150 and side electrode 152 in first insulator layer 146. Upper electrode 150 is formed in RDL 140 over dielectric-filled trench 180 and lower electrode 154. Upper electrode 150 and side electrode 152 are laterally spaced, e.g., by distance S (FIG. 1). Where one or both of electrodes 150, 154 are provided as an inductive coil 254 (FIGS. 4-5), the trenches formed can be in the desired spiral shape.

FIGS. 8A-8B also show forming a trench 162 into first insulator layer 146 between upper electrode 150 and side electrode 152 in first insulator layer 146. Trench 162 can be formed using a patterned mask 240 and using an appropriate etching process for first insulator layer 146, e.g., a reactive ion etch. Trench 162 does not expose BEOL interconnect layers 130, but extends sufficiently below RDL metal electrodes 150, 152 so isolation 160 that is eventually formed therein provides the desired dielectric strength and electrical isolation. Mask 240 may be removed using any appropriate mask removal process.

FIGS. 1 and 2 show filling trench 162 with at least one second insulator layer 166, 168. Each second insulator layer 166, 168 has a higher dielectric constant than first insulator layer 146. In one embodiment, first insulator layer 146 may include a polyimide, and second insulator layer(s) may include at least one nitride layer 166 and at least one oxide layer 168. While shown as not filling trench 162, a single, second insulator layer of, for example, nitride or oxide, may fill an entirety of trench 162, so isolation break 160 only includes a single insulator layer. In the example shown, nitride layer(s) 166 just coats sidewall 170 of trench 162, and at least one oxide layer 168 is over nitride layer(s) 166, filling a remaining portion of trench 162. The filling step(s) may include any appropriate deposition technique for the material formed. Any appropriate planarization may be carried out thereafter to remove excess material, e.g., CMP.

First insulator layer 146 and each second insulator layer 166, 168 are between upper electrode 150 and side electrode 152, creating a capacitor and horizontal portion 172 of galvanic isolation 110. Upper electrode 150 and lower electrode 154 are in first voltage domain 120, and side electrode 152 is in a second, different voltage domain 122. As partially shown in FIGS. 1 and 2, any conventional packaging processes may be carried out after isolation 110 formation, e.g., solder bump 144 formation, wire bonding, etc.

Galvanic isolation 110 provides a stronger (e.g., kilo-Volt level) galvanic isolation by increasing capacitive coupling using isolation break 160 and upper and side electrodes 150, 152 in a horizontal portion thereof in FBEOL interconnect layers 133. Isolation 110 provides stronger protection than available with more or thicker BEOL interconnect layers 132. The horizontal (lateral) portion 172 of isolation 110 also prevents lateral spiking of the high voltage contact on I/O pad 138. First insulator layer 146, which can be a polyimide packaging layer, can be made thinner than conventionally used, or can be made thicker to obtain higher galvanic isolation, when required. In addition, dielectric-filled trench 180 or DTI 184 under lower electrode 154 prevents parasitic capacitance from vertical portion 111 of galvanic isolation 110 from entering substrate 118. The formation processes illustrated are compatible with CMOS processing but have lower cost than increasing BEOL interconnect layer 132 thicknesses or numbers.

The methods described above are used in the fabrication of integrated circuit chips. The resulting integrated circuit chip packages can be integrated with other chip packages, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure, comprising:
    a substrate having a frontside and a backside;
    a first electrode in a first insulator layer adjacent to the frontside of the substrate, the first electrode being part of a redistribution layer (RDL);
    a second electrode between the substrate and the first electrode;
    a dielectric-filled trench in the substrate under the first electrode and the second electrode, the dielectric-filled trench extending fully to the backside of the substrate
    an isolation break in the first insulator layer between the first electrode and the second electrode, the isolation break including a trench defined in the first insulator layer and a second insulator in the trench; and
    a third electrode in the first insulator layer laterally spaced from the first electrode, the third electrode being part of the RDL,
    wherein the first insulator layer and the second insulator layer are between the first electrode and the second electrode.

2. The structure of claim 1, further comprising a shallow trench isolation (STI) in the substrate, the STI adjacent to the dielectric-filled trench, the STI extending less than the dielectric-filled trench toward the backside of the substrate.

3. The structure of claim 1, wherein the dielectric-filled trench is wider than the second electrode.

4. The structure of claim 1, wherein the second electrode is located in a first metal layer.

5. The structure of claim 1, wherein the second electrode is located in a metal layer above a first metal layer.

6. The structure of claim 1, wherein at least one of the first electrode and the second electrode include an inductive coil.

7. The structure of claim 1, wherein the first electrode and the second electrode are in a first voltage domain and are vertically separated by a plurality of interconnect layers, and
    wherein the third electrode is electrically coupled by a plurality of interconnect layers to a second voltage domain, the first voltage domain and the second voltage domain having different operative voltages.

8. The structure of claim 1, wherein the isolation break surrounds the first electrode.

9. A structure, comprising:
    a substrate having a frontside and a backside;
    a first electrode in a first insulator layer adjacent to the frontside of the substrate, the first electrode being part of a redistribution layer (RDL);
    an isolation break laterally adjacent to and surrounding the first electrode, the isolation break including a trench defined in the first insulator layer;
    a second electrode between the substrate and the first electrode; and
    a dielectric filled trench in the substrate under the first electrode and the second electrode, the dielectric-filled trench extending toward the backside of the substrate.

10. The structure of claim 9, further comprising a shallow trench isolation (STI) in the substrate, wherein the dielectric filled trench includes a deep trench isolation (DTI) adjacent to the STI, the STI extending less than the DTI toward the backside of the substrate.

11. The structure of claim 9, wherein the dielectric-filled trench is wider than the second electrode.

12. The structure of claim 9, wherein at least one of the first electrode and the second electrode include an inductive coil.

13. The structure of claim 9, wherein the second electrode is located in a first metal layer.

14. The structure of claim 9, wherein the second electrode is located in a metal layer above a first metal layer.

15. A method comprising:
    forming a dielectric-filled trench in a substrate, the dielectric-filled trench extending from a frontside to a backside of the substrate;
    forming a complementary metal oxide semiconductor (CMOS) device over the substrate;
    forming a first electrode over the dielectric-filled trench as part of forming a plurality of interconnect layers over the CMOS device, the plurality of interconnect layers including a redistribution layer (RDL) in a first insulator layer;
    forming an isolation break in a trench in the first insulator layer, the isolation break including at least one second insulator layer in the trench;
    forming a second electrode in the RDL and over the first electrode and the dielectric-filled trench;
    forming a third electrode in the RDL spaced from the second electrode, wherein a voltage domain of the third electrode is different from a voltage domain of the first electrode and the second electrode.

16. The method of claim 15, further comprising forming at least one of a shallow trench isolation (STI) and a through substrate via (TSV) in the substrate adjacent the dielectric-filled trench.

17. The method of claim 15, wherein the isolation break laterally surrounds the first electrode.

* * * * *